(12) United States Patent
Lee et al.

(10) Patent No.: US 9,907,164 B2
(45) Date of Patent: Feb. 27, 2018

(54) PRINTED CIRCUIT BOARD AND METHOD FOR MANUFACTURING THE SAME

(75) Inventors: Sang Myung Lee, Seoul (KR); Sung Woon Yoon, Seoul (KR); Hyuk Soo Lee, Seoul (KR); Sung Won Lee, Seoul (KR); Ki Do Chun, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 369 days.

(21) Appl. No.: 13/997,569

(22) PCT Filed: Dec. 23, 2011

(86) PCT No.: PCT/KR2011/010025
§ 371 (c)(1),
(2), (4) Date: Nov. 15, 2013

(87) PCT Pub. No.: WO2012/087059
PCT Pub. Date: Jun. 28, 2012

(65) Prior Publication Data
US 2014/0060893 A1 Mar. 6, 2014

(30) Foreign Application Priority Data

Dec. 24, 2010 (KR) .................. 10-2010-0134485
Dec. 24, 2010 (KR) .................. 10-2010-0134486

(51) Int. Cl.
*H05K 1/09* (2006.01)
*H05K 1/16* (2006.01)
(Continued)

(52) U.S. Cl.
CPC ............ *H05K 1/0298* (2013.01); *H05K 3/46* (2013.01); *H05K 3/4682* (2013.01); *H05K 3/465* (2013.01);
(Continued)

(58) Field of Classification Search
CPC ......... H05K 1/0298; H05K 2201/0338; H05K 2203/0376; H05K 3/46; H05K 3/4647; H05K 3/465; H05K 3/4652; H05K 3/4682
(Continued)

(56) References Cited

U.S. PATENT DOCUMENTS 4,303,798 A * 12/1981 Paunovic ...................... 174/257
5,326,643 A * 7/1994 Adamopoulos et al. .. 428/472.2
(Continued)

FOREIGN PATENT DOCUMENTS

CN 101018449 A 8/2007
JP 11186698 A 7/1999
(Continued)

OTHER PUBLICATIONS

International Search Report in International Application No. PCT/KR2011/010025, filed Dec. 23, 2011.
(Continued)

*Primary Examiner* — William H Mayo, III
*Assistant Examiner* — Rhadames J Alonzo Miller
(74) *Attorney, Agent, or Firm* — Saliwanchik, Lloyd & Eisenschenk

(57) ABSTRACT

Disclosed are a printed circuit board and a method for manufacturing the same. The printed circuit board includes a core insulating layer, at least one via formed through the core insulating layer, an inner circuit layer buried in the core insulating layer, and an outer circuit layer on a top surface or a bottom surface of the core insulating layer. The via includes a first part, a second part below the first part, and a third part between the first and second parts, and the third part includes a metal different from a metal of the first and second parts. The inner circuit layer and the via are simultaneously formed.

11 Claims, 6 Drawing Sheets

(51) Int. Cl.
    *H01B 13/00*   (2006.01)
    *H05K 1/02*    (2006.01)
    *H05K 3/46*    (2006.01)

(52) U.S. Cl.
    CPC ......... *H05K 3/4647* (2013.01); *H05K 3/4652* (2013.01); *H05K 2201/0338* (2013.01); *H05K 2203/0376* (2013.01)

(58) Field of Classification Search
    USPC .................................. 174/251, 260; 216/19
    See application file for complete search history.

(56) References Cited

U.S. PATENT DOCUMENTS

| | | | | |
|---|---|---|---|---|
| 5,442,143 | A * | 8/1995 | Schmidt et al. | 174/262 |
| 5,744,758 | A * | 4/1998 | Takenouchi et al. | 174/255 |
| 7,548,430 | B1 | 6/2009 | Huemoeller et al. | 361/760 |
| 2001/0020548 | A1* | 9/2001 | Burgess | 174/262 |
| 2002/0106516 | A1* | 8/2002 | Sato et al. | 428/413 |
| 2002/0131229 | A1* | 9/2002 | Jones et al. | 361/262 |
| 2002/0160219 | A1* | 10/2002 | Brenneman et al. | 428/626 |
| 2003/0155653 | A1* | 8/2003 | Iijima et al. | 257/758 |
| 2003/0215998 | A1* | 11/2003 | Coursey | H01L 28/91 438/255 |
| 2005/0150686 | A1* | 7/2005 | Powell | 174/262 |
| 2005/0153059 | A1* | 7/2005 | Wakizaka | 427/96.1 |
| 2006/0115970 | A1* | 6/2006 | Lee | C11D 7/3209 438/584 |
| 2006/0131176 | A1* | 6/2006 | Hsu | 205/125 |
| 2007/0070613 | A1* | 3/2007 | Kang | 361/803 |
| 2007/0080460 | A1* | 4/2007 | Yu | A44B 17/0029 257/758 |
| 2007/0163887 | A1* | 7/2007 | Hofmann | 205/80 |
| 2007/0185297 | A1* | 8/2007 | Tanaka et al. | 528/10 |
| 2007/0243402 | A1* | 10/2007 | Sato et al. | 428/606 |
| 2007/0281464 | A1* | 12/2007 | Hsu | 438/624 |
| 2008/0041823 | A1* | 2/2008 | La et al. | 216/97 |
| 2009/0288872 | A1* | 11/2009 | Kim et al. | 174/262 |
| 2010/0052993 | A1* | 3/2010 | Kim | 343/700 MS |
| 2010/0230145 | A1* | 9/2010 | Holcomb | 174/257 |
| 2010/0264549 | A1* | 10/2010 | Ko et al. | 257/774 |

FOREIGN PATENT DOCUMENTS

| | | | |
|---|---|---|---|
| JP | 2001-177240 | A | 6/2001 |
| JP | 2001177240 | A * | 6/2001 |
| JP | 200463701 | A | 2/2004 |
| JP | 2004063575 | A | 2/2004 |
| JP | 2004-265930 | A | 9/2004 |
| JP | 2005026645 | A | 1/2005 |
| JP | 2005-064203 | A | 3/2005 |
| JP | 2005064203 | A * | 3/2005 |
| JP | 2005223091 | A | 8/2005 |
| JP | 2005353420 | A | 12/2005 |
| JP | 2008-124370 | A | 5/2008 |
| JP | 2010267891 | A | 11/2010 |
| TW | 250555 | B | 3/2006 |

OTHER PUBLICATIONS

Notice of Allowance dated Nov. 8, 2012 in Korean Application No. 10-2010-0134485, filed Dec. 24, 2010.

Office Action dated Sep. 16, 2015 in Taiwanese Application No. 100147417.

Japanese Office Action dated Mar. 8, 2016 in Japanese Application No. 2013-546028.

Office Action dated Jul. 21, 2015 in Japanese Application No. 2013-546028.

* cited by examiner

[Fig. 1]
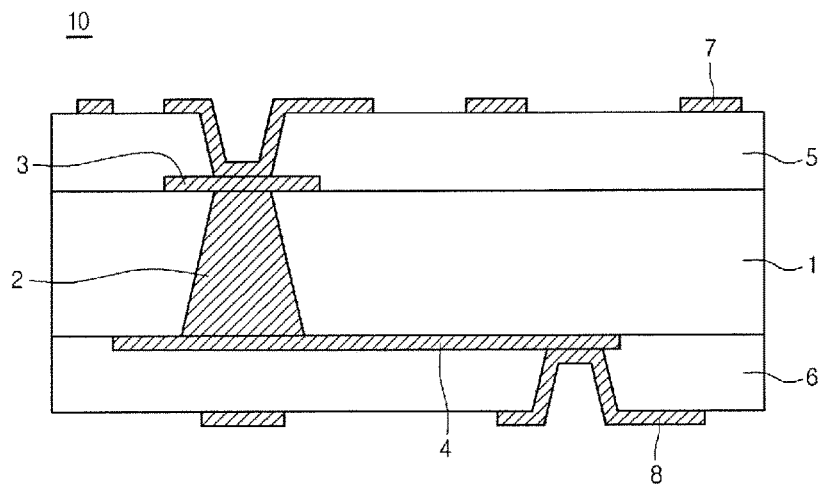
Prior Art
[Fig. 2]
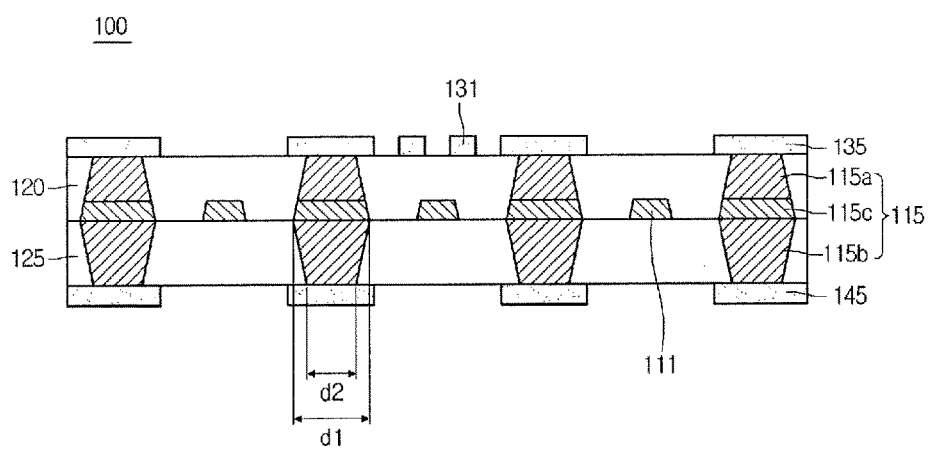
[Fig. 3]
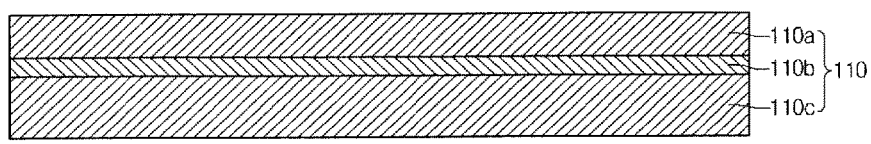
[Fig. 4]
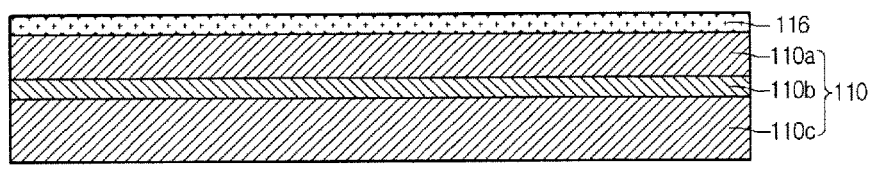
[Fig. 5]
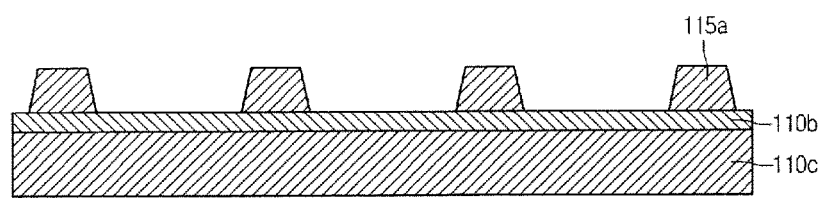

[Fig. 6]
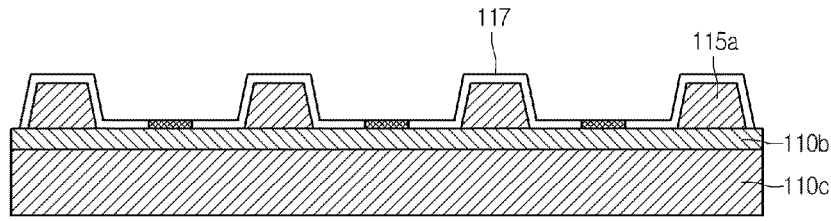
[Fig. 7]
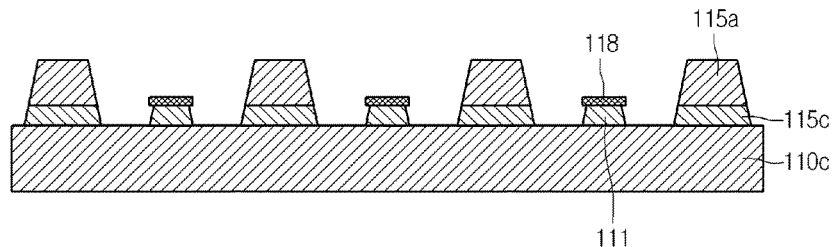
[Fig. 8]
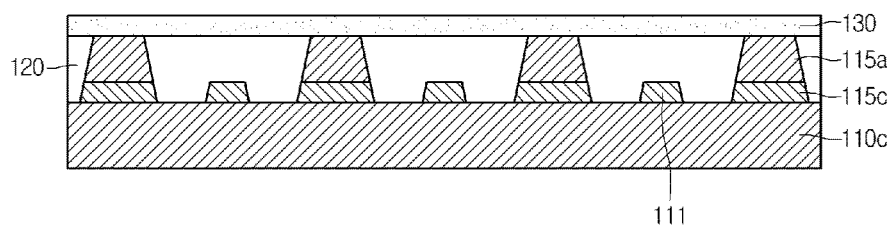
[Fig. 9]
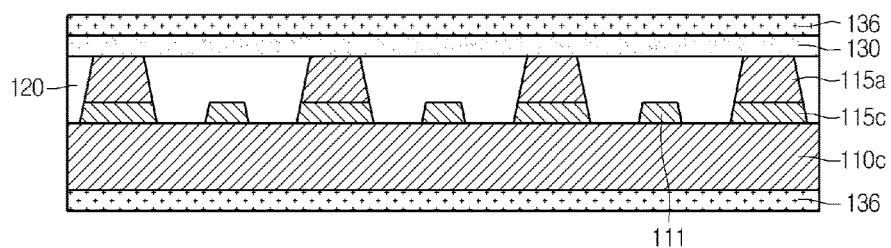
[Fig. 10]
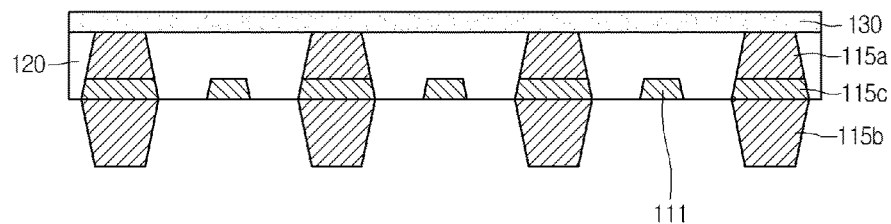
[Fig. 11]
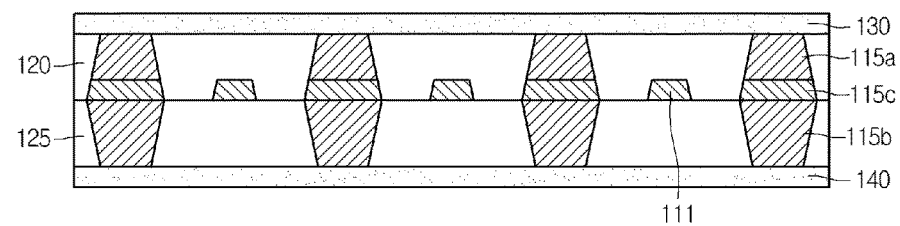

[Fig. 12]
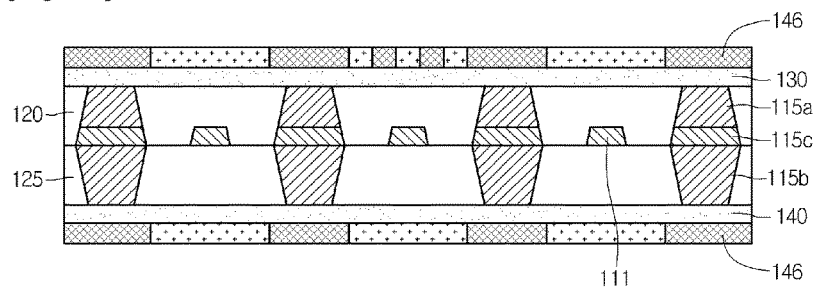
[Fig. 13]
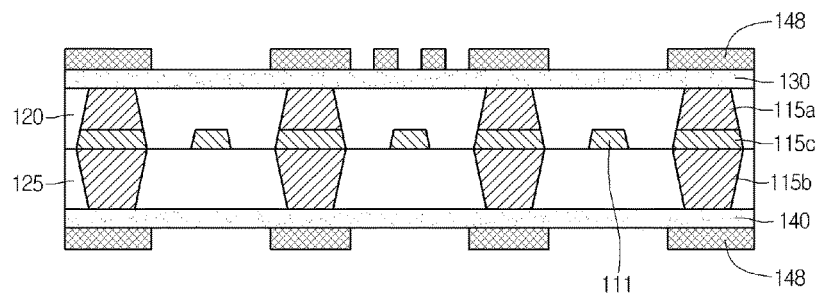
[Fig. 14]
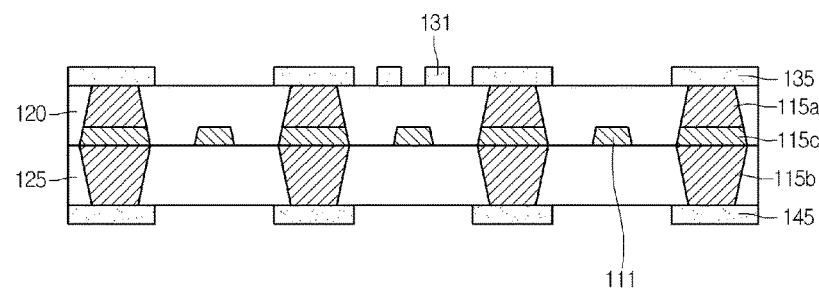
[Fig. 15]
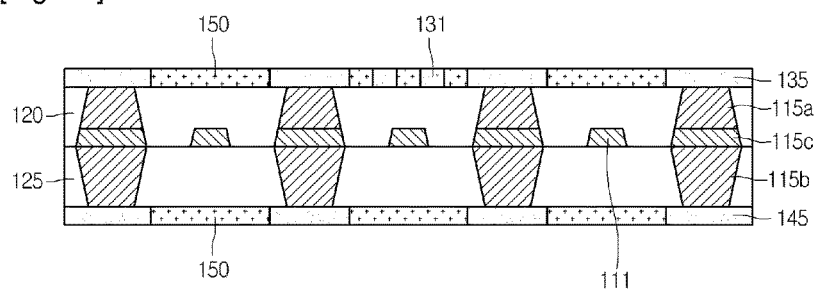
[Fig. 16]
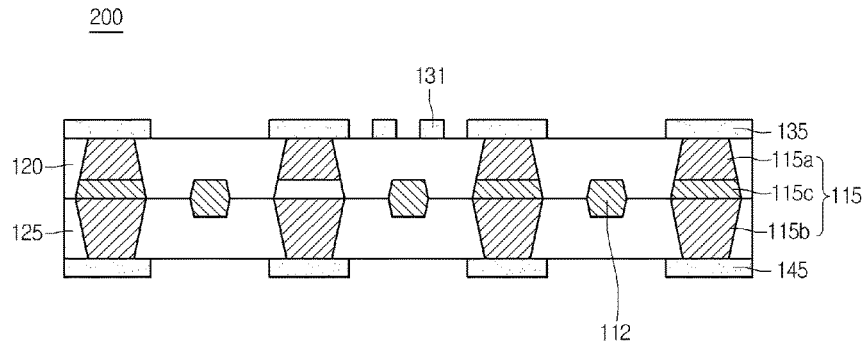

[Fig. 17]
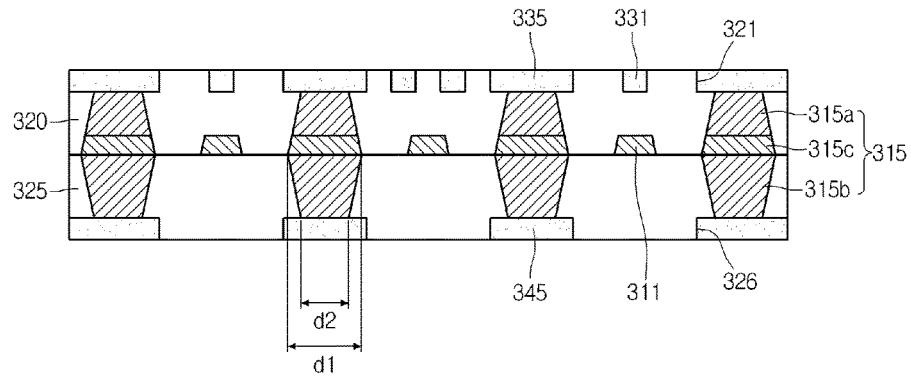
[Fig. 18]
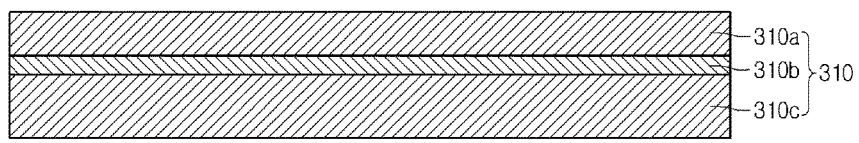
[Fig. 19]
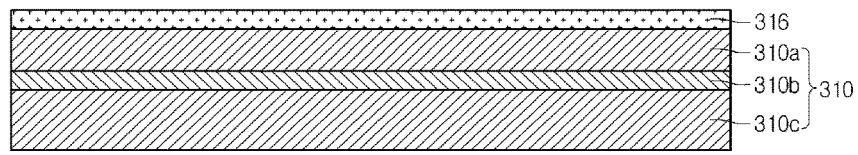
[Fig. 20]
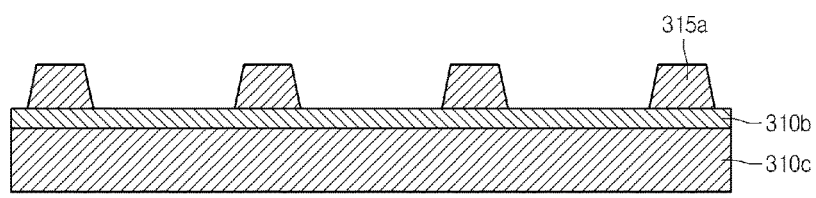
[Fig. 21]
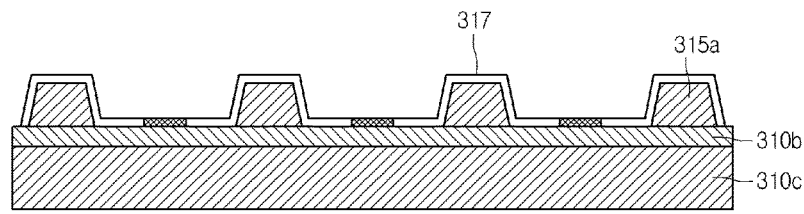
[Fig. 22]
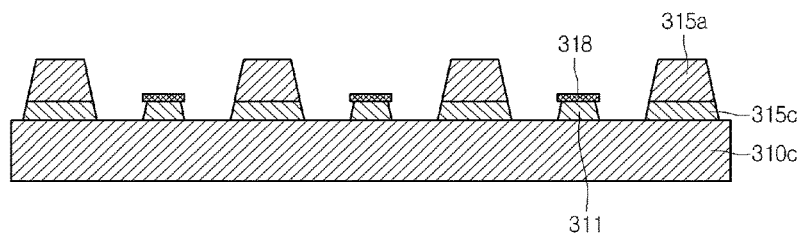

[Fig. 23]
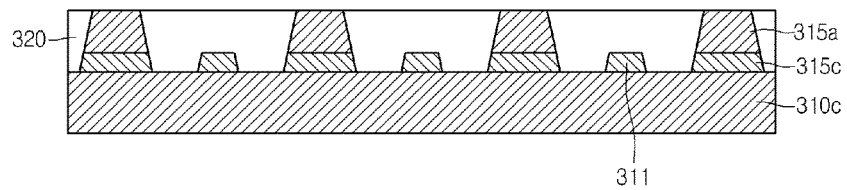
[Fig. 24]
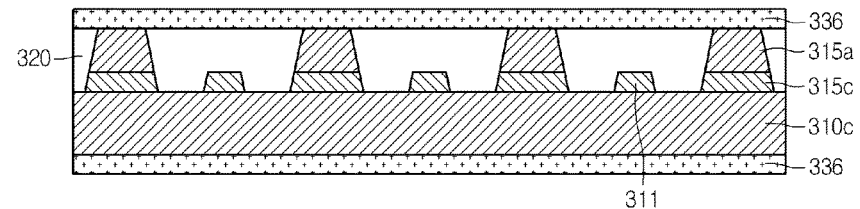
[Fig. 25]
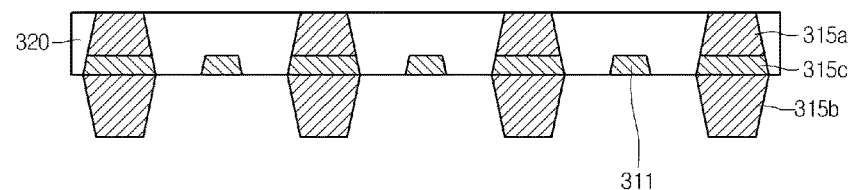
[Fig. 26]
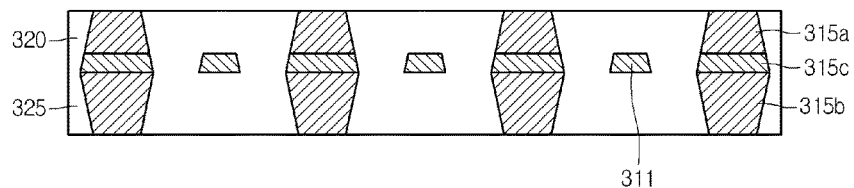
[Fig. 27]
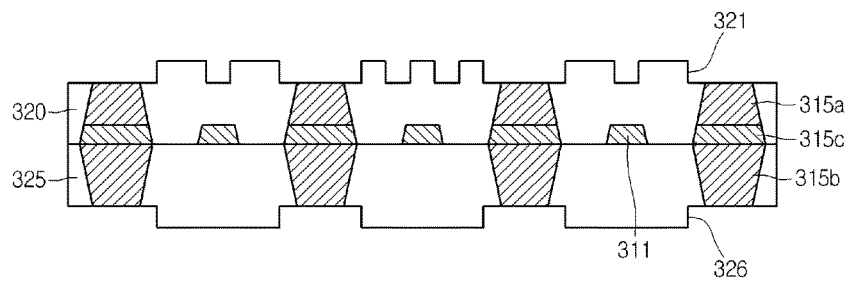
[Fig. 28]
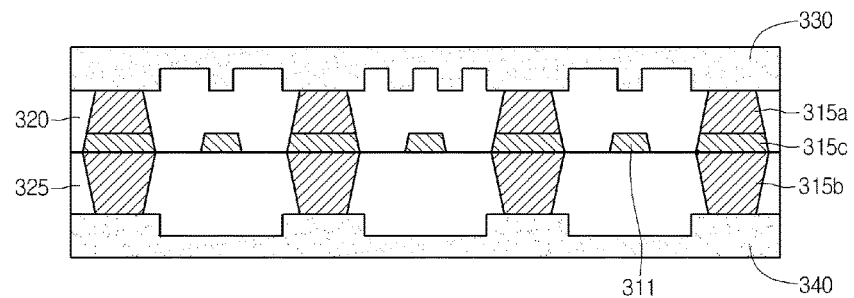

[Fig. 29]
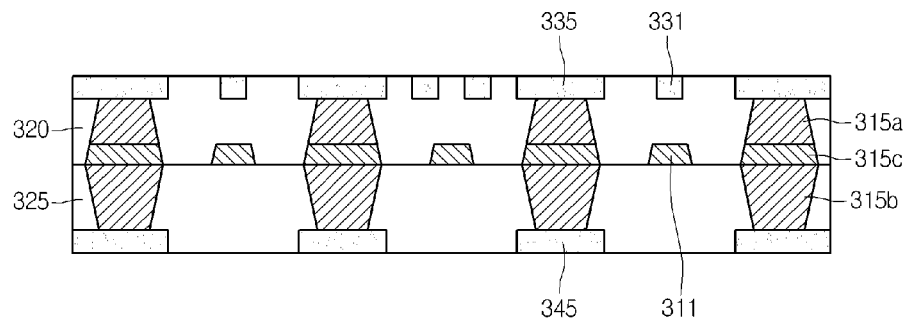
[Fig. 30]
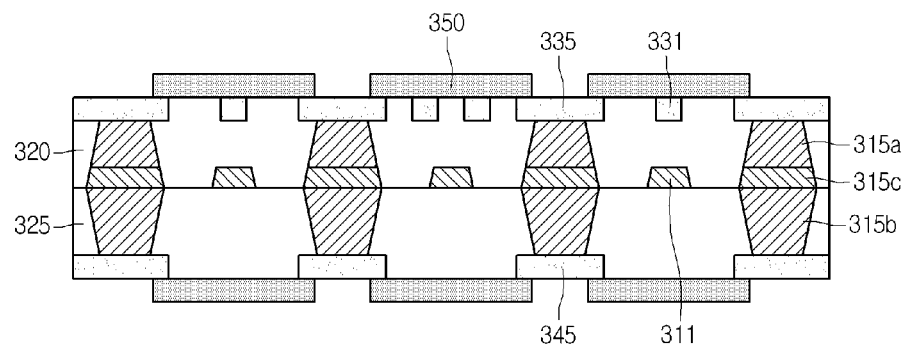
[Fig. 31]
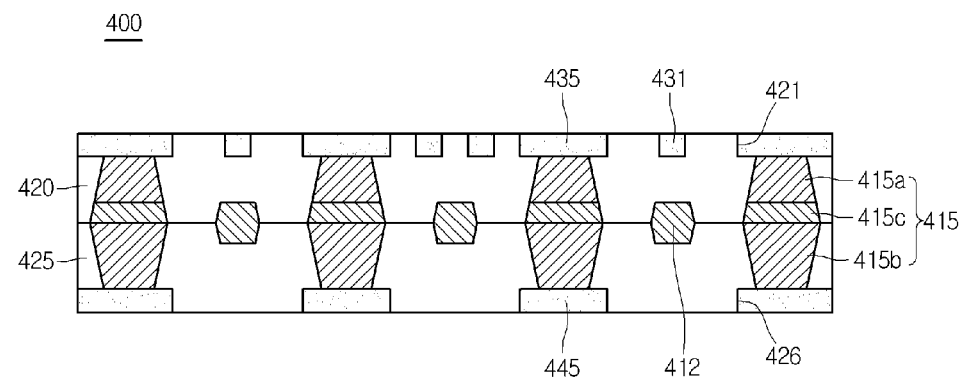

PRINTED CIRCUIT BOARD AND METHOD FOR MANUFACTURING THE SAME

CROSS-REFERENCE TO RELATED APPLICATIONS

This application is the U.S. national stage application of International Patent Application No. PCT/KR2011/010025, filed Dec. 23, 2011, which claims priority to Korean Application Nos. 10-2010-0134485, filed Dec. 24, 2010, and 10-2010-0134486, filed Dec. 24, 2010, the disclosures of each of which are incorporated herein by reference in their entirety.

TECHNICAL FIELD

A printed circuit board is formed by printing circuit line patterns on an insulating substrate using a conductive material such as copper. The printed circuit board refers to a board before electronic parts have been mounted thereon. That is, the printed circuit board refers to a circuit board, in which mounting positions are defined on a flat plate to mount various types of electronic devices and circuit patterns are fixedly printed on the flat plate to connect the electronic devices with each other.

BACKGROUND ART

Such a printed circuit board (PCB) may be classified into a single-layer PCB and a multi-layer PCB, such as a build-up board.

The build-up board, that is, the multi-layer PCB is manufactured one-layer by one-layer and the quality of the multi-layer PCB is evaluated to improve the product yield of the multi-layer PCB. In addition, interconnection lines are precisely connected to manufacture a high-density and small-size PCB. According to the build-up process, interconnection lines are formed between layers to connect the layers to each other through via holes formed in the layers. Instead of a mechanical drilling work, a laser process is performed to form the via holes having a micro size.

FIG. 1 is a sectional view showing a multi-layer PCB according to the related art.

Referring to FIG. 1, the multi-layer PCB 10 according to the related art includes a core insulating layer 1, inner circuit pattern layers 3 and 4 formed on and under the core insulating layer 1, upper and lower insulating layers 5 and 6 burying the inner circuit pattern layers 3 and 4 and outer circuit pattern layers 7 and 8 formed on the upper and lower insulating layers 5 and 6, respectively.

A conductive via 2 and conductive via holes are formed in the core insulating layer 1 and the upper and lower insulating layers 5 and 6 to electrically connect the inner circuit pattern layers 3 and 4 to the outer circuit pattern layers 7 and 8.

The multi-layer PCB 10 having the above structure according to the related art can be manufactured by forming even circuit pattern layers (four layers are shown in FIG. 1). After depositing insulating layers, two layers serving as outer layers are electrically connected to each other through the drilling work or the laser process. However, since the number of the circuit pattern layers is limited to the even number, a thickness of the substrate may be increased, so that the multi-layer PCB 10 may not be applicable for the portable electronic appliances or the substrates having the light and slim structure, such as semiconductor chips.

DISCLOSURE OF INVENTION

Technical Problem

The embodiment provides a printed circuit board having a novel structure and a method for manufacturing the same.

The embodiment provides a printed circuit board including odd circuit layers and a method for manufacturing the same.

Solution to Problem

A printed circuit board according to the embodiment includes a core insulating layer, at least one via formed through the core insulating layer, an inner circuit layer buried in the core insulating layer, and an outer circuit layer on a top surface or a bottom surface of the core insulating layer, wherein the via includes a first part, a second part below the first part, and a third part between the first and second parts, and the third part includes a metal different from a metal of the first and second parts.

A method for manufacturing a printed circuit board according to the embodiment includes the steps of preparing a metal substrate having a stack structure including a first metal layer, a second metal layer, and a third metal layer, forming a first part of a via by etching the first metal layer of the metal substrate, forming a connecting part and an inner circuit layer under the first part of the via by etching the second metal layer of the metal substrate, forming a second part of the via under the connecting part by etching the third metal layer of the metal substrate, forming an insulating layer to bury the via, and forming an outer circuit layer on a top surface or a bottom surface of the insulating layer.

Advantageous Effects of Invention

According to the embodiment, the inner circuit layer and the vias are simultaneously formed, so that the process steps can be reduced. In addition, since the printed circuit board includes odd circuit layers, the printed circuit board may have the light and slim structure.

In addition, the vias are buried in the insulating layer of the multi-layer printed circuit board, so the heat dissipation function can be improved. Since the plating method is not adopted to form the vias, the manufacturing cost can be reduced.

Further, the vias are formed by using the metal substrate including different types of metal layers, so the metal substrate can be prevented from being bent during the manufacturing process.

BRIEF DESCRIPTION OF DRAWINGS

FIG. 1 is a sectional view showing a printed circuit board according to the related art;

FIG. 2 is a sectional view showing a printed circuit board according to the first embodiment;

FIGS. 3 to 15 are sectional views for explaining the manufacturing procedure for the printed circuit board shown in FIG. 2;

FIG. 16 is a sectional view showing a printed circuit board according to the second embodiment;

FIG. 17 is a sectional view showing a printed circuit board according to the third embodiment;

FIGS. 18 to 30 are sectional views for explaining the manufacturing procedure for the printed circuit board shown in FIG. 17; and FIG. 31 is a sectional view showing a printed circuit board according to the fourth embodiment.

BEST MODE FOR CARRYING OUT THE INVENTION

Disclosed are a printed circuit board and a method for manufacturing the same. The printed circuit board includes a core insulating layer, at least one via formed through the core insulating layer, an inner circuit layer buried in the core insulating layer, and an outer circuit layer on a top surface or a bottom surface of the core insulating layer. The via includes a first part, a second part below the first part, and a third part between the first and second parts, and the third part includes a metal different from a metal of the first and second parts. The inner circuit layer and the via are simultaneously formed so that the process steps are reduced. Since odd circuit layers are provided, the printed circuit board has a light and slim structure.

MODE FOR THE INVENTION

Hereinafter, the embodiments will be described with reference to accompanying drawings in detail so that those skilled in the art to which the invention pertains can easily realize the embodiments. However, the embodiments may have various modifications without limitation.

In the following description, when a part is referred to as it includes a component, the part may not exclude other components but further include another component unless the context indicates otherwise.

The thickness and size of each layer shown in the drawings may be exaggerated, omitted or schematically drawn for the purpose of convenience or clarity. In addition, the size of elements does not utterly reflect an actual size. In the following description, the similar components will be assigned with the similar reference numerals.

In the description of the embodiments, it will be understood that, when a layer (or film), a region, or a plate is referred to as being on or under another layer (or film), another region, or another plate, it can be directly or indirectly on the other layer (or film), region, or plate, or one or more intervening layers may also be present.

According to the embodiment, a via and an inner circuit layer are simultaneously formed through the etching process, so that a multi-layer printed circuit board (PCB) including odd circuit layers can be formed without using the plating method.

Hereinafter, the PCB according to the embodiment will be described with reference to FIGS. 2 to 15.

FIG. 2 is a sectional view showing the PCB according to the first embodiment.

Referring to FIG. 2, the PCB 100 according to the embodiment includes a core insulating layer forming a first insulating layer 120 and a second insulating layer 125, vias 115 formed in the core insulating layer, an inner circuit layer 111 formed in the core insulating layer, and first and second outer circuit layers 131, 135 and 145 formed on the first and second insulating layers 120 and 125, respectively.

The first insulating layer 120 is formed on the second insulating layer 125 and an additional insulating layer (not shown) may be present between the first and second insulating layers 120 and 125.

The first and second insulating layers 120 and 125 may include a thermosetting polymer substrate, a thermoplastic polymer substrate, a ceramic substrate or an organic/inorganic composite substrate. The first and second insulating layers 120 and 125 may include polymer resin, such as epoxy insulating resin, or polyimide resin. In addition, the first and second insulating layers 120 and 125 can be formed by using resin including solid components, such as glass fiber.

The first and second insulating layers 120 and 125 can be formed by using the same material.

The first and second insulating layers 120 and 125 may have a thickness in the range of 30 µm to 80 µm, respectively.

The thickness of the core insulating layer having the stack structure of the first and second insulating layers 120 and 125 is in the range of 60 µm to 160 µm, preferably, in the range of 60 µm to 140 µm. The vias 115 and the inner circuit layer 111 are formed in the core insulating layer.

The vias 115 are conductive vias formed through the first and second insulating layers 120 and 125. The vias 115 have the largest width d1 at the boundary between the first and second insulating layers 120 and 125. The width of each via 115 is gradually narrowed as it reaches the top surface of the first and second insulating layers 120 and 125. Thus, a section of each via 115 meeting with the top surface of the first and second insulating layers 120 and 125 has the smallest width d2, so that the via 115 has a hexagonal sectional shape.

The widths d1 and d2 of the via 115 are in the range of about 20 µm to about 100 µm.

The via 115 is a conductive via and can be formed by using an alloy including Cu.

The via 115 includes a first part 115a buried in the first insulating layer 120 and formed by an alloy including Cu, a second part 115b buried in the second insulating layer 125 below the first part 115a and formed by an alloy identical to the alloy of the first part 115a, and a third part 115c interposed between the first and second parts 115a and 115b and formed by an alloy different from the alloy of the first and second parts 115a and 115b.

The third part 115c is formed at the center of the via 115, and the bottom surface of the third part 115c or the bottom surface of the second barrier layer 115e may have the largest width d1 of the via 115. The third part 115c can be formed by using the alloy including Ni, Fe, Co, Mo, or Cr. The third part 115c has the etching selectivity with respect to the first and second parts 115a and 115b.

The first and second parts 115a and 115b have the thickness in the range of 20 µm to 70 µm, and the third part 115c has the thickness in the range of 5 µm to 70 µm.

The inner circuit layer 111 is formed on the second insulating layer 125. A circuit pattern of the inner circuit layer 111 has the thickness in the range of 5 µm to 30 µm, and the width of about 50 µm or less, preferably, 30 µm, so that the micro pattern can be formed.

The inner circuit layer 111 has a rectangular sectional shape.

The inner circuit layer 111 is formed by using a material the same as that of the third part 115c of the via 115.

The outer circuit layers 131, 135 and 145 including via pads 135 and 145 connected to the via 115 and the circuit pattern 131 are formed on the top and bottom surfaces of the first and second insulating layers 120 and 125, respectively.

The outer circuit layers 131, 135 and 145 are classified into the first outer circuit layers 131 and 135 formed on the core insulating layer and the second outer circuit layer 145 formed under the core insulating layer.

The outer circuit layers 131, 135 and 145 may form the micro pattern having the line/space of 30/30. To this end, a copper layer having the thickness in the range of 6 µm to 30 µm is deposited and then the copper layer is etched to form the outer circuit layers 131, 135 and 145.

Although it has been described in that the outer circuit layers 131, 135 and 145 are formed on and under the core insulating layer in the form of a single layer, the embodiment is not limited thereto. For instance, after forming an upper insulating layer for burying the outer circuit layers 131, 135 and 145 on the first and second insulating layers 120 and 125, the circuit layer can be formed on the upper insulating layer to form the multi-layer PCB.

As described above, since the inner circuit layer 111 is buried in the core insulating layer of the PCB 100 according to the embodiment, the circuit layer having the number of 2n+1 (n is a positive integer) can be formed. In addition, the insulating layer has the number the same as that of the circuit layer on the basis of the core insulating layer so that the PCB can be prevented from being bent in one direction.

Thus, odd circuit layers can be formed without increasing the number of the insulating layers. In addition, since the vias 115 including the conductive material are formed in the core insulating layer, the heat dissipation efficiency can be improved.

Hereinafter, the method for manufacturing the PCB of FIG. 2 will be described with reference to FIGS. 3 to 15.

First, a conductive metal substrate 110 is prepared as shown in FIG. 3.

The conductive metal substrate 110 can be formed by using an alloy including Cu in the form of a rolled foil or an electrolytic foil. The conductive metal substrate 110 may have various thicknesses according to the specification of the product. The conductive metal substrate 110 has the stack structure of a first metal layer 110a, a second metal layer 110b and a third metal layer 110c.

The first and third metal layers 110a and 110c can be formed by using an alloy including Cu and the second metal layer 110b formed between the first and third metal layers 110a and 110c can be formed by using a metal having the etching selectivity with respect to the first and third metal layers 110a and 110c.

The second metal layer 110b can be formed by using an alloy including Ni, Fe, Co, Mo or Cr. In addition, the first and third metal layers 110a and 110c may have the thickness in the range of 20 µm to 70 µm and the second metal layer 110b may have the thickness in the range of 5 µm to 70 µm.

According to the embodiment, the metal substrate 110 preferably has the thickness in the range of 80 µm to 170 µm. The surface of the metal substrate 110 can be treated through a surface treatment process, such as pickling or flushing.

Then, as shown in FIG. 4, a photoresist film 116 is attached onto the top surface of the metal substrate 110.

The photoresist film 116 forms an etching pattern to etch the metal substrate 110. The photoresist film 116 may have various thicknesses in the range of 15 µm to 30 µm, and both of the UV exposure type photoresist film and the LDI exposure type photoresist film can be employed.

After that, as shown in FIG. 5, the photoresist film 116 is subject to the exposure and development process to form a photoresist pattern (not shown) and the metal substrate 110 is etched by using the photoresist pattern as a mask, thereby forming the first part 115a of the via 115.

Then, a part of the metal substrate 110 is wet etched by using wet etching solution, such as cupric chloride and iron chloride, to form the first part 115a of the via 115. Due to the etching selectivity between the first metal layer 110a and the second metal layer 110b, only the first metal layer 110a is etched when the first part 115a is formed.

As shown in FIG. 5, after the first part 115a of the via 115 has been etched, the photoresist pattern is delaminated by using the NaOH diluted solution.

Next, as shown in FIG. 6, a photoresist film 117 is formed on the first part 115a and an exposed front surface of the second metal layer 110b.

In order to form the inner circuit layer 111 by using the second metal layer 110b, a part of the photoresist film 117 formed on the second metal layer 110b is subject to the exposure and development process to form a photoresist pattern 118 shown in FIG. 7 and the second metal layer 110b is selectively etched by using the photoresist pattern 118 as a mask, thereby forming the inner circuit layer 111, the third part 115c of the via 115.

Due to the etching selectivity between the first and second metal layers 110a and 110b, the first part 115a of the via may serve as an etching mask when forming the third part 115c.

As the third metal layer 110c formed under the second metal layer 110b is exposed, the etching process is stopped and the inner circuit layer 111 is formed. The inner circuit layer 111 has a rectangular sectional shape.

After that, as shown in FIG. 8, the first insulating layer 120 is formed in such a manner that the first and third parts 115a and 115c of the via 115 and the inner circuit layer 111 can be buried in the first insulating layer 120.

The first insulating layer 120 can be formed by using thermosetting resin or thermoplastic resin having the solid component, such as glass fiber, or having no solid component. The first insulating layer 120 may have the thickness in the range of about 30 µm to about 80 µm.

Then, a copper foil layer 130 is formed on the first insulating layer 120.

The copper foil layer 130 is a metal layer serving as a base of the first outer circuit layers 131 and 135 and has the thickness in the range of 6 µm to 30 µm such that the line/space can be formed as to 30/30 µm. Preferably, the copper foil layer 130 has the thickness in the range of 6 µm to 20 µm such that the line/space can be formed as to 15/15 µm or below.

The first insulating layer 120 and the copper foil layer 130 can be formed by using CCL (copper cladded laminate).

Then, as shown in FIG. 9, photoresist films 136 are formed on the copper foil layer 130 and under the metal substrate 110, respectively.

The photoresist film 136 formed under the metal substrate 110 serves as a base to form a photoresist pattern used to form the second part 115b of the via 115 and the inner circuit layer 111. In addition, the photoresist film 136 formed on the copper foil layer 130 serves as a base to form a photoresist pattern under the metal substrate 110 and as a protective film to protect the copper foil layer 130 during the etching process for the metal substrate 110.

Thus, the photoresist film 136 formed on the copper foil layer 130 can be replaced with a protective film or a protective organic layer and can be omitted.

After that, as shown in FIG. 10, the photoresist film 136 formed under the metal substrate 110 is developed to form the photoresist pattern and the metal substrate 110 is etched by using the photoresist pattern as a mask, thereby forming the second part 115b under the first part 115a of the via 115.

In this manner, upper and lower portions of the via 115 are divided into first to third parts 115a, 115b and 115c through the etching process so that the via 115 has the hexagonal sectional shape in which the center of the via 115 has the largest width d1 and the width becomes narrow from the center to the outer portion of the via 115.

As the second part 115*b* of the via 115 has been formed, the photoresist pattern is delaminated. Then, as shown in FIG. 11, the second insulating layer 125 is deposited such that the first part 115*a* of the via 115 can be buried in the second insulating layer 125 and a copper foil layer 140 is deposited on the second insulating layer 125.

The material and the thickness of the second insulating layer 125 and the copper foil layer 140 may be identical to those of the first insulating layer 120 and the copper foil layer 130 formed on the first insulating layer 120.

Then, as shown in FIG. 12, photoresist films 146 are attached onto the copper foil layers 130 and 140, respectively.

The photoresist films 146 may have various thicknesses in the range of 15 μm to 30 μm and both of the UV exposure type photoresist film and the LDI exposure type photoresist film can be employed.

Then, the photoresist films 146 are subject to the exposure and development process so that photoresist patterns 148 are formed on the copper foil layers 130 and 140, respectively, as shown in FIG. 13. After that, the copper foil layers 130 and 140 are etched by using the photoresist patterns 148 as a mask, thereby forming the pads 135 and 145 and the circuit pattern 131 as shown in FIG. 14.

The pads 135 and 145 and the circuit pattern 131 may constitute the first outer circuit layers 131 and 135 formed on the first insulating layer 120 and the second outer circuit layer 145. The first outer circuit layers 131 and 135 include the upper pad 135 connected to the first part 115*a* of the via 115 and the upper circuit pattern 131 including the copper foil layer 130 identical to the copper foil layer 130 of the upper pad 135. The second outer circuit layer 145 includes the lower pad 145 connected to the second part 115*b* of the via 115 and a lower circuit pattern (not shown) including the copper foil layer 140 identical to the copper foil layer 140 of the lower pad 145.

Finally, as shown in FIG. 15, the circuit pattern 131 of the outer circuit layers 131, 135 and 145 is buried and a coverlay 150 is formed to expose the pads 135 and 145.

In this manner, different from the related art in which the via hole is formed by drilling the insulating layer and the via is formed by burying the via hole, the embodiment forms the insulating layers 120 and 125 burying the via 115 after forming the via 115 by etching the metal substrate 110, thereby reducing the manufacturing cost. In addition, since the inner circuit layer 111 is formed by using the metal substrate identical to the via 115, the manufacturing steps can be reduced.

Although it has been described in that the outer circuit layers 131, 135 and 145 are formed by etching the copper foil layer, the embodiment is not limited thereto. For instance, the outer circuit layers 131, 135 and 145 can be formed by performing the plating process with respect to the photoresist.

Hereinafter, a PCB according to the second embodiment will be described with reference to FIG. 16.

Referring to FIG. 16, the PCB 200 according to the second embodiment includes a core insulating layer forming a first insulating layer 120 and a second insulating layer 125, vias 115 formed in the core insulating layer, an inner circuit layer 112 formed in the core insulating layer, and first and second outer circuit layers 131, 135 and 145 formed on the first and second insulating layers 120 and 125, respectively.

The first insulating layer 120 is formed on the second insulating layer 125 and an additional insulating layer may be present between the first and second insulating layers 120 and 125.

The first and second insulating layers 120 and 125 can be formed by using resin including solid components, such as glass fiber. The first and second insulating layers 120 and 125 can be formed by using the same material.

The first and second insulating layers 120 and 125 have a stack structure to form the core insulating layer. The core insulating layer may have a thickness in the range of about 60 μm to about 140 μm. The via 115 and the inner circuit layer 112 are formed in the core insulating layer.

The vias 115 are conductive vias formed through the first and second insulating layers 120 and 125. The vias 115 have the largest width d1 at the boundary between the first and second insulating layers 120 and 125. The width of each via 115 is gradually narrowed as it reaches the top surface of the first and second insulating layers 120 and 125. Thus, the via 115 has a hexagonal sectional shape.

The widths d1 and d2 of the via 115 are in the range of about 20 μm to about 100 μm.

The via 115 is a conductive via and can be formed by using an alloy including Cu.

The via 115 includes a first part 115*a* buried in the first insulating layer 120 and formed by an alloy including Cu, a second part 115*b* buried in the second insulating layer 125 below the first part 115*a* and formed by an alloy identical to the alloy of the first part 115*a*, and a third part 115*c* interposed between the first and second parts 115*a* and 115*b* and formed by an alloy different from the alloy of the first and second parts 115*a* and 115*b*.

The third part 115*c* is formed at the center of the via 115, and the bottom surface of the third part 115*c* may have the largest width d1 of the via 115. The third part 115*c* may be formed by using the alloy including Ni, Fe, Co, Mo or Cr and may have the etching selectivity with respect to the first and second parts 115*a* and 115*b*.

The first and second parts 115*a* and 115*b* have the thickness in the range of 20 μm to 70 μm, and the third part 115*c* has the thickness in the range of 5 μm to 70 μm.

The inner circuit layer 112 has a rectangular sectional shape or a hexagonal sectional shape. The inner circuit layer 112 has the width of about 60 μm or less, preferably, 50 μm, so that the micro pattern can be formed.

The inner circuit layer 112 is formed by using a material the same as that of the third part 115*c* of the via 115.

The outer circuit layers 131, 135 and 145 including via pads 135 and 145 connected to the via 115 and the circuit pattern 131 are formed on the top and bottom surfaces of the first and second insulating layers 120 and 125, respectively.

The outer circuit layers 131, 135 and 145 are formed on the surfaces of the first and second insulating layers 120 and 125 and the inner circuit layer 112 is formed on the second insulating layer 125.

The outer circuit layers 131, 135 and 145 can be formed by depositing the copper foil layer and then etching the copper foil layer.

In the PCB 200 shown in FIG. 16, the circuit pattern of the inner circuit layer 112 has a rectangular sectional shape, which is symmetrically formed about the boundary between the first and second insulating layers 120 and 125 similar to the via 115. The region buried in the first insulating layer 120 includes the material the same as that of the third part 115*c* of the via 115, and the region buried in the second insulating layer 125 includes the material the same as that of the third part 115*c* of the via 115.

The inner circuit layer 112 shown in FIG. 16 can be formed by using the manufacturing method shown in FIGS. 3 to 15. In the process shown in FIGS. 9 and 10, when the second part 115b of the via 115 is formed, the region to be buried in the second insulating layer 125 of the inner circuit layer 112 can be simultaneously formed.

As described above, since the inner circuit layer 112 is buried in the core insulating layer of the PCB 200 according to the embodiment, the circuit layer having the number of 2n+1 (n is a positive integer) can be formed. In addition, the insulating layer has the number the same as that of the circuit layer on the basis of the core insulating layer so that the PCB can be prevented from being bent in one direction.

Thus, odd circuit layers can be formed without increasing the number of the insulating layers. In addition, since the vias 115 including the conductive material are formed in the core insulating layer, the heat dissipation efficiency can be improved.

In addition, an intermediate layer of the metal substrate is formed by using a hetero metal, so the metal substrate can be prevented from being bent during the manufacturing process.

Hereinafter, the PCB according to the third embodiment will be described with reference to FIGS. 17 to 30.

FIG. 17 is a sectional view showing the PCB according to the third embodiment.

Referring to FIG. 17, the PCB 300 according to the embodiment includes a core insulating layer forming a first insulating layer 320 and a second insulating layer 325, vias 315 formed in the core insulating layer, an inner circuit layer 311 formed in the core insulating layer, and first and second outer circuit layers 331, 335 and 345 formed on the first and second insulating layers 320 and 325, respectively.

The first insulating layer 320 is formed on the second insulating layer 325 and an additional insulating layer (not shown) may be present between the first and second insulating layers 320 and 325.

The first and second insulating layers 320 and 325 may include a thermosetting polymer substrate, a thermoplastic polymer substrate, a ceramic substrate or an organic/inorganic composite substrate. The first and second insulating layers 320 and 325 may include polymer resin, such as epoxy insulating resin, or polyimide resin. In addition, the first and second insulating layers 320 and 325 can be formed by using resin including solid components, such as glass fiber.

The first and second insulating layers 320 and 325 can be formed by using the same material.

The first and second insulating layers 320 and 325 may have a thickness in the range of about 30 μm to about 80 μm, respectively.

The thickness of the core insulating layer having the stack structure of the first and second insulating layers 320 and 325 is in the range of about 60 μm to about 160 μm, preferably, in the range of about 60 μm to about 140 μm. The vias 315 and the inner circuit layer 311 are formed in the core insulating layer.

The vias 315 are conductive vias formed through the first and second insulating layers 320 and 325. The vias 315 have the largest width d1 at the boundary between the first and second insulating layers 320 and 325. The width of each via 315 is gradually narrowed as it reaches the top surface of the first and second insulating layers 320 and 325. Thus, a section of each via 315 meeting with the top surface of the first and second insulating layers 320 and 325 has the smallest width d2, so that the via 315 has a hexagonal sectional shape.

The widths d1 and d2 of the via 315 are in the range of about 20 μm to about 300 μm.

The via 315 is a conductive via and can be formed by using an alloy including Cu.

The via 315 includes a first part 315a buried in the first insulating layer 320 and formed by an alloy including Cu, a second part 315b buried in the second insulating layer 325 below the first part 315a and formed by an alloy identical to the alloy of the first part 315a, and a third part 315c interposed between the first and second parts 315a and 315b and formed by an alloy different from the alloy of the first and second parts 315a and 315b.

The third part 315c is formed at the center of the via 315, and the bottom surface of the third part 315c may have the largest width d1 of the via 315. The third part 315c can be formed by using the alloy including Ni, Fe, Co, Mo or Cr and has the etching selectivity with respect to the first and second part 315a and 315b.

The first and second parts 315a and 315b have the thickness in the range of 20 μm to 70 μm, and the third part 315c has the thickness in the range of 5 μm to 70 μm.

The inner circuit layer 311 is formed on the second insulating layer 325. A circuit pattern of the inner circuit layer 311 has the thickness in the range of 6 μm to 30 μm, and the width of about 50 μm or less, preferably, 30 μm, so that the micro pattern can be formed.

The inner circuit layer 311 has a rectangular sectional shape.

The inner circuit layer 311 is formed by using a material the same as that of the third part 315c of the via 315.

Via pads 335 and 345 connected to the via 315 and pattern grooves 321 and 326 to form the circuit pattern 331 are formed on the top and bottom surfaces of the first and second insulating layers 320 and 325, respectively.

The outer circuit layers 331, 335 and 345 can be formed while filling the pattern grooves 321 and 326.

The outer circuit layers 331, 335 and 345 are classified into the first outer circuit layers 331 and 335 for filling the pattern grooves 321 and 326 formed on the first insulating layer 320, which is an upper layer of the core insulating layer, and the second outer circuit layer 345 for filling the pattern grooves 321 and 326 formed on the bottom surface of the second insulating layer 325, which is a lower layer of the core insulating layer.

The outer circuit layers 331, 335 and 345 can be prepared as a single layer as shown in FIG. 2. In addition, the outer circuit layers 331, 335 and 345 can be prepared as a multiple layer including a lower seed layer and an upper plating layer. The seed layer is shallowly formed along the lateral sides and the bottom surface of the pattern grooves 321 and 326 through the electroless plating, the sputtering, etc.

In addition, the seed layer can be formed by using an alloy including Cu, Ni, Pd, or Cr.

The plating layer is formed on the seed layer through the electroplating process. The plating layer is formed by using an alloy including Cu, Ag, Au, Ni, or Pd and filled in the pattern grooves 321 and 326.

The pattern grooves 321 and 326 formed in the first and second insulating layers 320 and 325 may have the rectangular sectional shape or the curved sectional shape according to the manufacturing method thereof. Preferably, the pattern grooves 321 and 326 have the U-sectional shape.

Although it has been described in that the outer circuit layers 331, 335 and 345 are formed on and under the core insulating layer in the form of a single layer, the embodiment is not limited thereto. For instance, after forming upper insulating layers covering the outer circuit layers 331, 335 and 345 on the first and second insulating layers 320 and 325, respectively, the circuit layer can be formed on the upper insulating layers to form the multi-layer PCB.

As described above, since the inner circuit layer 311 is buried in the core insulating layer of the PCB 300 according to the embodiment, the circuit layer having the number of 2n+1 (n is a positive integer) can be formed. In addition, the insulating layer has the number the same as that of the circuit layer on the basis of the core insulating layer so that the PCB can be prevented from being bent in one direction.

Thus, odd circuit layers can be formed without increasing the number of the insulating layers. In addition, since the vias 315 including the conductive material are formed in the core insulating layer, the heat dissipation efficiency can be improved.

In addition, the outer circuit layers can be formed through the plating process after forming the grooves in the insulating layer. In this case, the micro pattern can be formed.

Hereinafter, the method for manufacturing the PCB of FIG. 17 will be described with reference to FIGS. 18 to 30.

First, a conductive metal substrate 310 is prepared as shown in FIG. 18.

The conductive metal substrate 310 can be formed by using an alloy including Cu in the form of a rolled foil or an electrolytic foil. The conductive metal substrate 310 may have various thicknesses according to the specification of the product. The conductive metal substrate 310 has the stack structure of a first metal layer 310a, a second metal layer 310b and a third metal layer 310c.

The first and third metal layers 310a and 310c can be formed by using an alloy including Cu. The second metal layer 310b interposed between the first and third metal layers 310a and 310c can be formed by using a metal having the etching selectivity with respect to the first and third metal layers 310a and 310c.

The second metal layer 310b can be formed by using an alloy including Ni, Fe, Co, Mo or Cr. The first and second metal layers 310a and 310b may have the thickness in the range of 20 μm to 70 μm and the second metal layers 310b may have the thickness in the range of 5 μm to 70 μm.

According to the embodiment, the metal substrate 310 preferably has the thickness in the range of 80 μm to 170 μm. The surface of the metal substrate 310 can be treated through a surface treatment process, such as pickling or flushing.

Then, as shown in FIG. 19, a photoresist film 316 is attached onto the top surface of the metal substrate 310.

The photoresist film 316 forms an etching pattern to etch the metal substrate 310. The photoresist film 316 may have various thicknesses in the range of 15 μm to 30 μm, and both of the UV exposure type photoresist film and the LDI exposure type photoresist film can be employed.

After that, as shown in FIG. 20, the photoresist film 316 is subject to the exposure and development process to form a photoresist pattern (not shown) and the metal substrate 310 is etched by using the photoresist pattern as a mask, thereby forming the first part 315a of the via 315.

Then, a part of the metal substrate 310 is wet etched by using wet etching solution, such as cupric chloride and iron chloride, to form the first part 315a of the via 315. Due to the etching selectivity between the first and second metal layers 310a and 310b, only the first metal layer 310a is etched when the first part 315a is formed.

After the first part 315a of the via 315 and the inner circuit layer 311 have been etched, the photoresist pattern is delaminated by using the NaOH diluted solution.

Next, as shown in FIG. 21, a photoresist film 317 is formed on the first part 315a and an exposed front surface of the second metal layer 310b.

In order to form the inner circuit layer 311 by using the second metal layer 310b, a part of the photoresist film 317 formed on the second metal layer 310b is subject to the exposure and development process to form a photoresist pattern 318 shown in FIG. 22 and the second metal layer 310b is selectively etched by using the photoresist pattern 318 as a mask, thereby forming the inner circuit layer 311 and the third part of the via 315.

Due to the etching selectivity between the first metal layer 310a and the second metal layer 310b, the first part 315a of the via 315 may serve as the etching mask for the third part 315c.

As the third metal layer 310c formed under the second metal layer 310b is exposed, the etching process is stopped and the inner circuit layer 311 is formed. The inner circuit layer 311 has a rectangular sectional shape.

Then, as shown in FIG. 23, the first insulating layer 320 is formed in such a manner that the first and third parts 315a and 315c of the via 315 and the inner circuit layer 311 can be buried in the first insulating layer 320.

The first insulating layer 320 can be formed by using thermosetting resin or thermoplastic resin having the solid component, such as glass fiber, or having no solid component. The first insulating layer 320 may have the thickness in the range of about 30 μm to about 80 μm.

Then, as shown in FIG. 24, photoresist films 336 are formed on the first insulating layer 320 and under the metal substrate 310, respectively.

The photoresist film 336 formed under the metal substrate 310 serves as a base to form a photoresist pattern used to form the second part 315b of the via 315 and the inner circuit layer 311. In addition, the photoresist film 336 formed on the first insulating layer 320 serves as a base to form a photoresist pattern under the metal substrate 310 and as a protective film to protect the upper layer during the etching process for the metal substrate 310.

Thus, the photoresist film 336 formed on the first insulating layer 320 can be omitted.

After that, as shown in FIG. 25, the photoresist film 336 formed under the metal substrate 310 is developed to form the photoresist pattern and the metal substrate 310 is etched by using the photoresist pattern as a mask, thereby forming the second part 315b under the first part 315a of the via 315.

In this manner, upper and lower portions of the via 315 are divided into first to third parts 315a, 315b and 315c through the etching process so that the via 315 has the hexagonal sectional shape in which the center of the via 315 has the largest width d1 and the width becomes narrow from the center to the outer portion of the via 315.

As the second part 315b of the via 315 has been formed, the photoresist pattern is delaminated. Then, as shown in FIG. 26, the second insulating layer 325 is deposited such that the second part 315b of the via 315 can be buried in the second insulating layer 325.

Then, as shown in FIG. 27, the pattern grooves 321 and 326 are formed on the surfaces of the first and second insulating layers.

The pattern grooves 321 and 326 may include via pad grooves for exposing the via and circuit pattern grooves for burying the circuit pattern.

In order to form the pattern grooves 321 and 326 in the first and second insulating layers, an excimer laser using a pattern mask or a UV-YAG laser without using a pattern mask can be used.

If the excimer laser is used, one of XeCl (308 nm), Krf (248 nm) and ArF (193 nm) can be utilized. If the pattern grooves 321 and 326 are formed in the first and second insulating layers, the pattern grooves 321 and 326 have the V-sectional shape or the rectangular sectional shape according to the line/space of the circuit and the vibration depth.

In contrast, if the UV-YAG laser is used, the pattern grooves 321 and 326 have the curved sectional shape. Preferably, the pattern grooves 321 and 326 have the U-sectional shape.

After that, as shown in FIG. 28, plating layers 330 and 340 are formed to fill the pattern grooves 321 and 326.

In detail, the seed layer is formed over the whole surface of the first and second insulating layers 320 and 325 through electroless plating process. Before the seed layer has been formed through the electroless plating process by using Cu, the pretreatment process, such as the cleanet process, the soft etching process, the pre-catalyst process, the catalyst treating process, or the accelerating process, can be performed.

Meanwhile, the sputtering process can be performed instead of the electroless plating process. According to the sputtering process, ion particles (for instance, Ar+) of gas generated by plasma collide with a copper target to form a copper metal layer on the insulating layers 320 and 325.

In addition, the seed layer can be formed through the electroless plating process or the sputtering process by using a Ni—Pd alloy or a Ni—Cr alloy instead of copper.

Then, the electroplating process is performed on the seed layer to form the conductive plating layers 330 and 340 over the whole area of the first and second insulating layers 320 and 325 such that the pattern grooves 321 and 326 can be filled with the plating layers 330 and 340.

The plating layers 330 and 340 can be formed by using an alloy including Cu, Ag, Au, Ni or Pd. Preferably, the alloy including Cu is plated.

In order to form the plating layers 330 and 340, a substrate is immersed in a Cu plating bath and the electroplating process is performed by using a DC rectifier or a pulse rectifier. According to the electroplating process, the plating area is calculated and current is applied to the DC rectifier or the pulse rectifier to extract the metal.

As described above, the plating layers 330 and 340 shown in FIG. 28 can be obtained through the electroless plating process or the electroplating process. In contrast, the pattern grooves 321 and 326 can be filled by performing the electrodeless plating process with respect to the conductive metal.

Then, as shown in FIG. 29, the plating layers 330 and 340 and the seed layer are completely removed until the surfaces of the first and second insulating layers 320 and 325 are exposed.

Thus, the outer circuit layers 331, 335 and 345 are formed only in the pattern grooves 321 and 326. The plating layers 330 and 340 can be removed through the flash etching process. If the thickness of the plating layers 330 and 340 to be removed is too heavy, the half etching process may be performed prior to the flash etching process.

Finally, as shown in FIG. 30, the circuit pattern 331 of the outer circuit layers 331, 335 and 345 is buried and a coverlay 350 is formed to expose the pads 335 and 345.

In this manner, different from the related art in which the via hole is formed by drilling the insulating layer and the via is formed by burying the via hole, the embodiment forms the insulating layers 320 and 325 burying the via 315 after forming the via 315 by etching the metal substrate 310, thereby reducing the manufacturing cost. In addition, since the inner circuit layer 311 is formed by using the metal substrate identical to the via 315, the manufacturing steps can be reduced.

Hereinafter, a PCB according to the fourth embodiment will be described with reference to FIG. 31.

Referring to FIG. 31, the PCB 400 according to the fourth embodiment includes a core insulating layer forming a first insulating layer 420 and a second insulating layer 425, vias 415 formed in the core insulating layer, an inner circuit layer 412 formed in the core insulating layer, and first and second outer circuit layers 431, 435 and 445 formed on the first and second insulating layers 420 and 425, respectively.

The first insulating layer 420 is formed on the second insulating layer 425 and an additional insulating layer may be present between the first and second insulating layers 420 and 425.

The first and second insulating layers 420 and 425 can be formed by using resin including solid components, such as glass fiber. The first and second insulating layers 420 and 425 can be formed by using the same material.

The first and second insulating layers 420 and 425 have a stack structure to form the core insulating layer. The core insulating layer may have a thickness in the range of about 60 μm to about 140 μm. The via 415 and the inner circuit layer 412 are formed in the core insulating layer.

The vias 415 are conductive vias formed through the first and second insulating layers 420 and 425. The vias 415 have the largest width at the boundary between the first and second insulating layers 420 and 425. The width of each via 415 is gradually narrowed as it reaches the top surface of the first and second insulating layers 420 and 425. Thus, the via 415 has a hexagonal sectional shape.

The widths d1 and d2 of the via 415 are in the range of about 20 μm to about 100 μm.

The via 415 is a conductive via and can be formed by using an alloy including Cu.

The via 415 includes a first part 415a buried in the first insulating layer 420 and formed by an alloy including Cu, a second part 415b buried in the second insulating layer 425 below the first part 415a and formed by an alloy identical to the alloy of the first part 415a, and a third part 415c interposed between the first and second parts 415a and 415b and formed by an alloy different from the alloy of the first and second parts 415a and 415b.

The third part 415c is formed at the center of the via 415, and the bottom surface of the third part 415c may have the largest width d1 of the via 415. The third part 415c can be formed by using the alloy including Ni, Fe, Co, Mo or Cr and may have the etching selectivity with respect to the first and second parts 415a and 415b.

The first and second parts 415a and 415b have the thickness in the range of 20 μm to 70 μm, and the third part 415c has the thickness in the range of 5 μm to 70 μm.

The inner circuit layer 412 may have a rectangular sectional shape. The inner circuit layer 412 has the width of about 60 μm or less, preferably, 50 μm or less, so that the micro pattern can be formed.

The inner circuit layer 412 is formed by using a material the same as that of the third part 415c of the via 415.

Via pads 435 and 445 connected to the via 415 and pattern grooves 421 and 426 to form the circuit pattern 431 are formed on the top and bottom surfaces of the first and second insulating layers 420 and 425, respectively.

The outer circuit layers 431, 435 and 445 can be formed while filling the pattern grooves 421 and 426.

The outer circuit layers 431, 435 and 445 are classified into the first outer circuit layers 431 and 435 for filling the pattern grooves 421 and 426 formed on the first insulating layer 420, which is an upper layer of the core insulating layer, and the second outer circuit layer 445 for filling the pattern grooves 421 and 426 formed on the bottom surface of the second insulating layer 425, which is a lower layer of the core insulating layer.

The outer circuit layers 431, 435 and 445 can be prepared as a single layer as shown in FIG. 2. In addition, the outer circuit layers 431, 435 and 445 can be prepared as a multiple layer including a lower seed layer and an upper plating layer. The seed layer is shallowly formed along the lateral sides and the bottom surface of the pattern grooves 421 and 426 through the electroless plating, the sputtering, etc.

In addition, the seed layer can be formed by using an alloy including Cu, Ni, Pd, or Cr.

The plating layer is formed on the seed layer through the electroplating process. The plating layer is formed by using an alloy including Cu, Ag, Au, Ni, or Pd and filled in the pattern grooves 421 and 426.

The pattern grooves 421 and 426 formed in the first and second insulating layers 420 and 425 may have the rectangular sectional shape or the curved sectional shape according to the manufacturing method thereof. Preferably, the pattern grooves 421 and 426 have the U-sectional shape.

In the PCB 400 shown in FIG. 31, the circuit pattern of the inner circuit layer 412 has a polygonal sectional shape, which is symmetrically formed about the boundary between the first and second insulating layers 420 and 425 similar to the via 415. Preferably, the circuit pattern of the inner circuit layer 412 has a rectangular sectional shape or a hexagonal sectional shape. In detail, a part of the inner circuit layer 412 is buried in the first insulating layer 420 and the remaining part of the inner circuit layer 412 is buried in the second insulating layer 425.

The inner circuit layer 412 shown in FIG. 31 can be formed through the manufacturing method shown in FIGS. 18 to 30.

As described above, since the inner circuit layer 412 is buried in the core insulating layer of the PCB 400 according to the embodiment, the circuit layer having the number of 2n+1 (n is a positive integer) can be formed. In addition, the insulating layer has the number the same as that of the circuit layer on the basis of the core insulating layer so that the PCB can be prevented from being bent in one direction.

Thus, odd circuit layers can be formed without increasing the number of the insulating layers. In addition, since the vias 415 including the conductive material are formed in the core insulating layer, the heat dissipation efficiency can be improved.

In addition, an intermediate layer of the metal substrate is formed by using a hetero metal, so the metal substrate can be prevented from being bent during the manufacturing process.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A printed circuit board comprising:
a first insulating layer;
a second insulating layer disposed below the first insulating layer;
a via formed through the first and second insulating layers;
an inner circuit layer buried in the first and second insulating layers; and
an outer circuit layer on a top surface of the first insulating layer or a bottom surface of the second insulating layer;
wherein the via includes a first part, a second part below the first part, and a third part between the first and second parts, and the third part includes a metal different from a metal of the first and second parts;
wherein the inner circuit layer comprises:
a first portion buried in a lower part of the first insulating layer, and
a second portion buried in an upper part of the second insulating layer and directly contacted with the first portion;
wherein the inner circuit layer is spaced apart from the via in a horizontal direction;
wherein a sectional shape of the third part of the via is the same as a sectional shape of the first portion of the inner circuit layer,
wherein a top surface of the third part of the via lies in a same plane as a top surface of the first portion of the inner circuit layer,
wherein a bottom surface of the third part of the via lies in a same plane as a bottom surface of the first portion of the inner circuit layer,
wherein the first and second parts of the via are formed by using a same material,
wherein the first portion of the inner circuit layer and the third part of the via are formed by using a same material,
wherein a bottom surface of the first part is directly contacted with a top surface of the third part, and a bottom surface of the third part is directly contacted with a top surface of the second part;
wherein a combined sectional shape of the first part, the second part, and the third part is hexagonal; and
wherein a combined sectional shame of the first portion and the second portion is hexagonal.

2. The printed circuit board of claim 1, wherein the first and second parts of the via are formed by using a same material.

3. The printed circuit board of claim 1, wherein the first portion of the inner circuit layer is symmetrical to the second portion of the inner circuit layer about a boundary between the first insulating layer and the second insulating layer.

4. The printed circuit board of claim 1, wherein the printed circuit board comprises a circuit layer including the inner circuit layer and the outer circuit layer and having a number of 2n+1 (n is a positive integer).

5. The printed circuit board of claim 1, wherein the outer circuit layer is filled in a pattern groove formed in the top surface of the first insulating layer or the bottom surface of the second insulating layer.

6. The printed circuit board of claim 5, wherein the pattern groove has a U-sectional shape.

7. A method for manufacturing a printed circuit board, the method comprising:
preparing a metal substrate having a stack structure including a first metal layer, a second metal layer, and a third metal layer;
forming a first part of a via by etching the first metal layer of the metal substrate;

simultaneously forming a connecting part of the via and a first portion of an inner circuit layer by etching the second metal layer of the metal substrate;

simultaneously forming a second part of the via under the connecting part and a second portion of the inner circuit layer under the first portion by etching the third metal layer of the metal substrate;

forming a first insulating layer to bury the first part of the via, the connecting part, and the first portion of the inner circuit layer;

forming a second insulating layer to bury the second part of the via and the second portion of the inner circuit layer; and forming an outer circuit layer on a top surface of the first insulating layer or a bottom surface of the second insulating layer;

wherein the inner circuit layer is spaced apart from the via in a horizontal direction;

wherein a sectional shape of the connecting part of the via is same as a sectional shape of the first portion of the inner circuit layer, wherein a top surface of the connecting part of the via lies in a same plane as a top surface of the first portion of the inner circuit layer, wherein a bottom surface of the connecting part of the via lies in a same plane as a bottom surface of the first portion of the inner circuit layer, wherein the first and second parts of the via are formed by using a same material, wherein the first inn, layer and the connecting part of the via are, formed by using a same material, wherein a bottom surface of the first part is directly contacted with a top surface of the connecting part, and a bottom surface of the connecting part is directly contacted with a top surface of the second part;

wherein a combined sectional shape of the first part, the second part, and the connection part is hexagonal; and wherein a combined sectional shape of the first portion and the second portion is hexagonal.

8. The method of claim 7, wherein the forming of the outer circuit layer comprises:

forming a copper foil layer on the first insulating layer and under the second insulating layer;

forming a photoresist pattern on the copper foil layer; and forming the outer circuit layer by etching the copper foil layer using the photoresist pattern as a mask.

9. The method of claim 7, wherein a width of a boundary between the second and connecting parts of the via is larger than a width of a top surface of the first part or a bottom surface of the second part.

10. The method of claim 7, wherein the first portion of the inner circuit layer is symmetrical to the second portion of the inner circuit layer about a boundary between the first insulating layer and the second insulating layer.

11. The method of claim 7, wherein the forming of the outer circuit layer comprises:

forming a pattern groove on the top surface of the first insulating layer or the bottom surface of the second insulating layer; and forming the outer circuit layer by plating a conductive material to fill the pattern groove.

* * * * *